United States Patent [19]

Bruder et al.

[11] Patent Number: 5,068,609
[45] Date of Patent: Nov. 26, 1991

[54] METHOD FOR GENERATING AN IMAGE USING NUCLEAR MAGNETIC RESONANCE SIGNALS

[75] Inventors: Herbert Bruder, Hemhofen; Hubertus Fischer, Erlangen; Franz Schmitt, Baiersdorf; Hans-Erich Reinfelder, Erlangen, all of Fed. Rep. of Germany

[73] Assignee: Siemens Aktiengesellschaft, Munich, Fed. Rep. of Germany

[21] Appl. No.: 524,344

[22] Filed: May 16, 1990

[30] Foreign Application Priority Data

May 16, 1989 [EP] European Pat. Off. ............ 89108772

[51] Int. Cl.$^5$ ............................................. G01R 33/20
[52] U.S. Cl. ..................................................... 324/309
[58] Field of Search ................. 128/654; 324/300, 307, 324/309, 318, 322, 312, 313

[56] References Cited

U.S. PATENT DOCUMENTS

| | | | |
|---|---|---|---|
| 4,165,479 | 8/1979 | Mansfield | 324/309 |
| 4,444,196 | 4/1984 | Stein | 128/654 |
| 4,706,023 | 11/1987 | Den Boef | 324/309 |
| 4,766,380 | 8/1988 | Den Boef et al. | 324/309 |
| 4,908,573 | 3/1990 | Kaufman et al. | 324/309 |

FOREIGN PATENT DOCUMENTS

| | | |
|---|---|---|
| 0021535 | 1/1981 | European Pat. Off. . |
| 4145277 | 6/1985 | European Pat. Off. . |
| 0155052 | 9/1985 | European Pat. Off. . |
| 0177990 | 4/1986 | European Pat. Off. . |
| 2056078 | 8/1979 | United Kingdom . |

OTHER PUBLICATIONS

"Clinical Applications And Methodological Developments of The Rare Technique," Hennig et al., Mag. Res. Imag., vol. 6, 1988, pp. 391–395.

Primary Examiner—Michael J. Tokar
Attorney, Agent, or Firm—Hill, Van Santen, Steadman & Simpson

[57] ABSTRACT

A method for generating an image using nuclear magnetic resonance signals, which substantially eliminates the presence of so-called "N/2 ghosts," includes the steps of dividing a measurement matrix into a first sub-matrix containing the even-numbered rows of the measurement matrix and into a second sub-matrix having the odd-numbered rows of the measurement matrix, setting the entries in the remaining rows of the sub-matrices to zero, subjecting both sub-matrices to a Fourier transformation at least in the column direction, thereby generating respective intermediate image matrices, multiplying one of the intermediate image matrices by a factor which is calculated from the edge rows of the intermediate image matrices, and adding the intermediate image matrices after the multiplication.

4 Claims, 5 Drawing Sheets

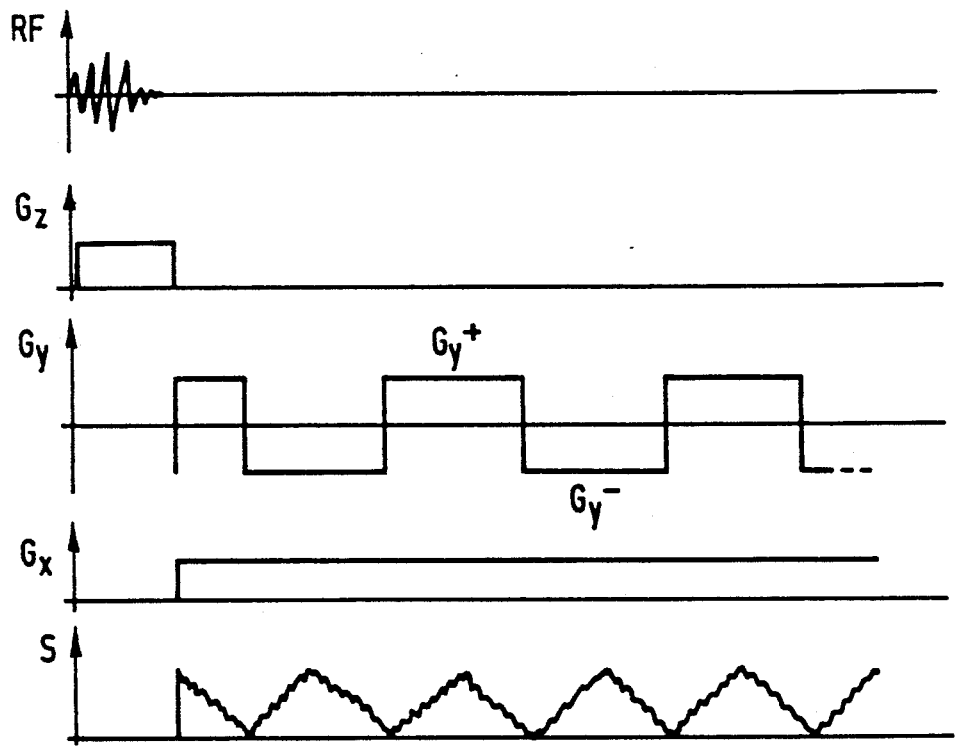
FIG 2
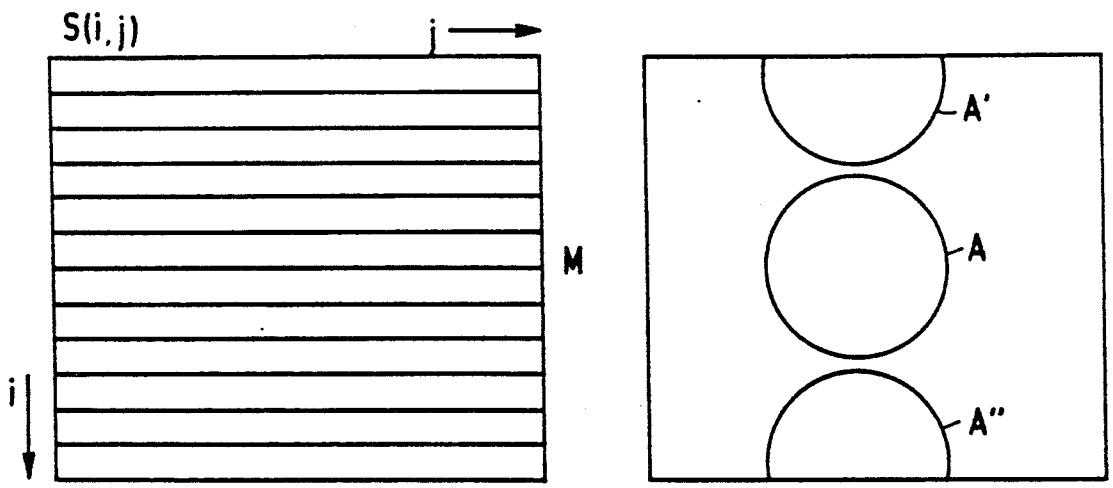
FIG 3
FIG 4
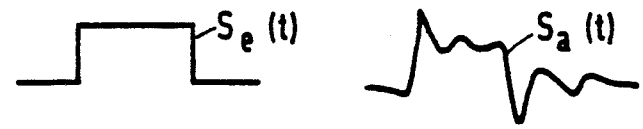
FIG 5
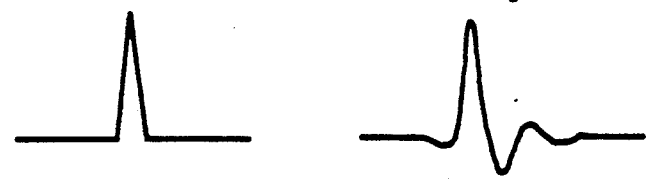
FIG 6

5,068,609

METHOD FOR GENERATING AN IMAGE USING NUCLEAR MAGNETIC RESONANCE SIGNALS

BACKGROUND OF THE INVENTION

1. Field of the Invention

The present invention is directed to a method for generating an image using nuclear magnetic resonance signals, and in particular to a method wherein "N/2 ghosts" are substantially eliminated.

2. Description of Prior Art

In general, the generation of an image using nuclear magnetic resonance signals is undertaken by exciting at least a portion of an examination subject with RF pulses while the subject is disposed in a fundamental magnetic field, thereby causing nuclear magnetic resonance signals to arise in the patient. These signals are read out in the presence of first and second gradient magnetic fields, and are sampled in the time domain. The samples acquired in this manner for specific individual pulses of one of the two gradient fields are respectively entered into a row of a measurement matrix, and the measurement matrix is subjected to a Fourier transformation for generating the image.

Many sequences of RF pulses and various gradient magnetic fields are known in the art for obtaining a topically resolved image. The pulse sequence which is required in a given method for the acquisition of a row of the measurement matrix is referred to as a "scan." In some known pulse sequences, the measurement or processing condition for the measured signals changes periodically from scan to scan, i.e. from row to row of the measurement matrix. This occurs, for example, in the echo planar method, as disclosed in German Patent 27 55 956 and in the RARE method as described in the article "Clinical Applications and Methodological Developments of the RARE Technique," Hennig et al., Magnetic Resonance Imaging, Vol. 6, pp. 391-395. Even if only slight deviations occur from line to line, this results in an image artifact known as "N/2 ghosts," which means that in an image matrix of N×N points, the actual image appears again within the image field, shifted by N/2 points in the positive and negative directions, with respect to the middle of the image matrix. The shifted image appears with a different intensity than the actual image.

SUMMARY OF THE INVENTION

It is an object of the present invention to provide a method for generating an image using nuclear magnetic resonance signals using a method which is susceptible to N/2 ghosts, but wherein such N/2 ghosts are substantially eliminated.

The above object is achieved in accordance with the principles of the present invention in a method wherein at least a portion of an examination subject disposed in a fundamental magnetic field is subjected to RF pulses, thereby generating nuclear magnetic resonance signals in the patient. These signals are read out under the influence of first and second gradient magnetic fields, and are sampled in the time domain. Samples for defined individual pulses of one of the gradient fields are entered into a row of a measurement matrix, and this process is repeated for each scan. The measurement matrix is divided into a first sub-matrix and a second sub-matrix. The first sub-matrix contains only the entries of the even-numbered rows of the measurement matrix, with the entries in the odd-numbered rows being set to zero. The second sub-matrix contains only the samples of the measurement matrix of the odd-numbered rows, with the entries of the even-numbered rows being set to zero. Both sub-matrices are subjected to a Fourier transformation at least in the column direction, so that respective intermediate image matrices arise. One of the intermediate image matrices is multiplied by a factor which is calculated from the edge rows of the intermediate image matrices according to a specified equation. The one image matrix multiplied by the factor is then added to the other image matrix. The resulting sum matrix is substantially free of N/2 ghosts.

The above method can be incorporated in known imaging sequences, such as the echo planar imaging sequence and the RARE method.

DESCRIPTION OF THE DRAWINGS

FIG. 2 is a graphical representation of signals which are present in the operation of the apparatus shown in FIG. 1.

FIG. 3 schematically indicates the format of a measurement matrix obtained in accordance with the principles of the present invention.

FIG. 4 is schematic representation of the presence of "N/2 ghosts" in an image.

FIG. 5 shows an input signal in the form of a rectangular function, and the resulting output signal, for a conventional analog low-pass filter.

FIG. 6 shows an input function, in the form of a delta function, and the resulting output signal for a conventional analog low-pass filter.

DESCRIPTION OF THE PREFERRED EMBODIMENTS

Figure 1:
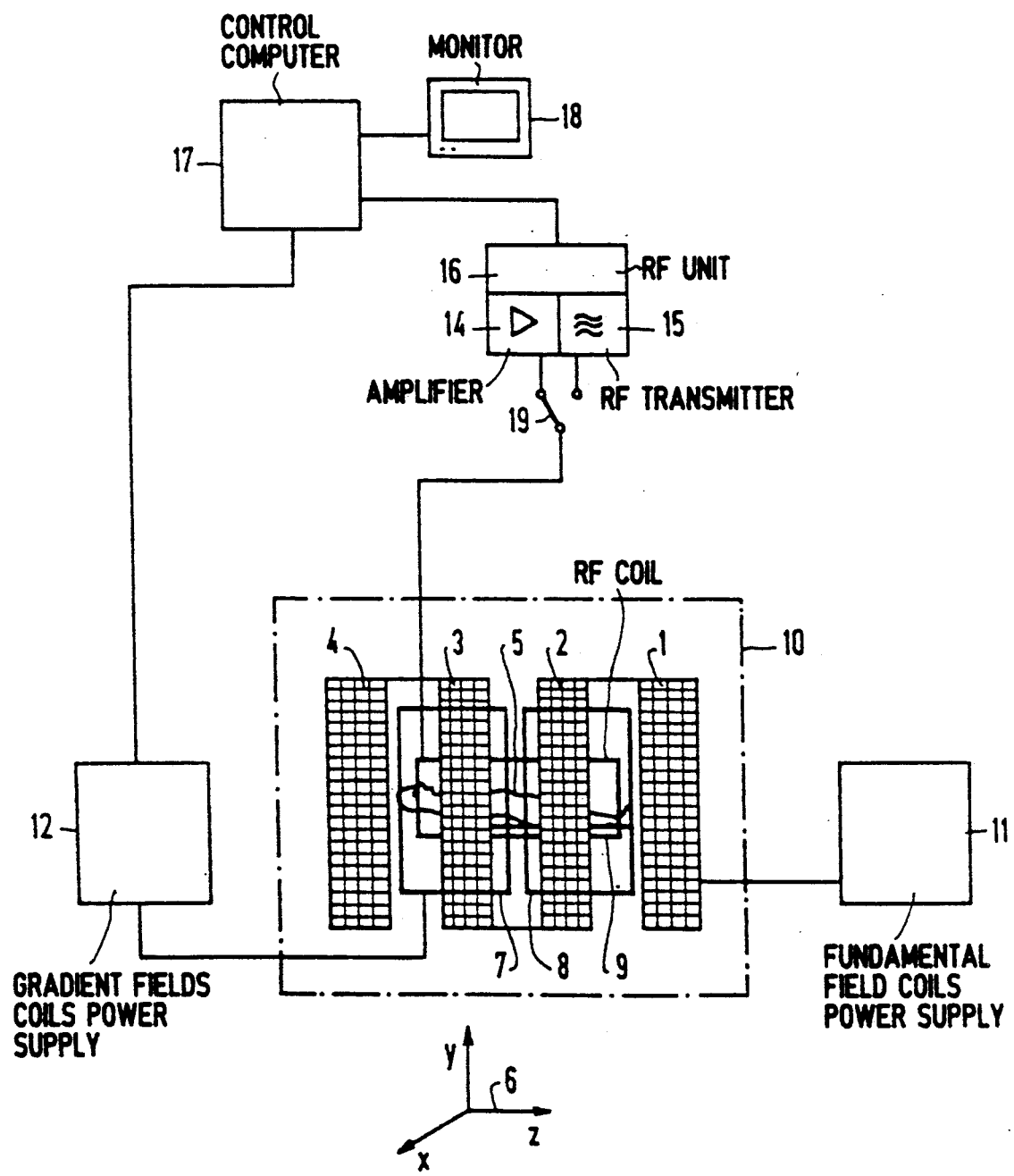
FIG. 1 is a schematic block diagram of a magnetic resonance imaging apparatus operable in accordance with the method of the present invention.

The basic components of a magnetic resonance imaging tomography apparatus as shown in FIG. 1. Coils 1, 2, 3 and 4 generate a fundamental magnetic field in which, for medical diagnostics, an examination subject 5 is situated. Sets of gradient coils are also provided which generate orthogonal magnetic field components in the x, y and z directions of the coordinate system 6. For clarity, only the gradient coils 7 and 8 are shown in FIG. 1, which generate the x-gradient field together with a pair of identical gradient coils on the opposite side of the examination subject 5. A set of y-gradient coils (not shown) are disposed parallel to each other above and below the examination subject 5. A set of z-gradient coils (not shown) are disposed at the foot end and the head end of the examination subject 5, transversely relative to the longitudinal axis of the examination subject 5.

The apparatus also includes a RF coil 9, which is used to transmit RF pulses to the examination subject for inducing magnetic resonance signals therein, and for receiving the resulting magnetic resonance signals. The coils 1, 2, 3, 4, 7, 8 and 9 bounded by the dot-dash line 10 represent the actual examination instrument.

The examination instrument is operated by an electrical arrangement which includes a power supply 11 for the fundamental field coils 1–4, and a gradient coils power supply 12 to which the gradient coils 7 and 8, and the other gradient coils, are connected. The RF coil 9 is connected via an RF unit 16 to a control computer 17. In a transmit mode, the RF coil 9 is connected to a transmitter 15 which causes the examination subject 5 to be subjected to the RF pulses. In a receive mode, the RF coil 9 is connected to an amplifier 14 which amplifies the incoming magnetic resonance signals and supplies them to the computer 17. A switch 19 enables switching between the two modes. The computer formulates the measurement matrix from the received signals, from which a visual image is obtained and displayed on a monitor 18.

A number of pulse sequences are known for operating the RF unit 16 and the various gradient coils. The most prevalent methods are those wherein the imaging is based on a two-dimensional or three-dimensional Fourier transformation of the acquired measured values.

As noted above, the method disclosed herein is intended for use with those types of known imaging methods which are susceptible to N/2 ghosts. The inventive method will be described below in two exemplary embodiments of methods which are susceptible to this type of image artifact, namely the echo planar sequence and the RARE sequence.

The basic steps of the echo planar imaging method shall be set forth below with reference to the pulse diagrams of FIG. 2. A more detailed description of the known echo planar imaging method is disclosed in the aforementioned German Patent 27 55 956.

As shown in FIG. 2, under the influence of a gradient $G_z$ in the z-direction, a radio frequency pulse RF is generated which excites only one slice of the examination subject, due to the $G_z$ gradient.

After this excitation, a gradient $G_y$ in the y-direction is generated. The gradient $G_y$ has an alternating polarity, i.e. it is composed of individual pulses which alternate in polarity. Due to the alternating polarity, the resulting FID signal is de-phased each time, and is then again re-phased, so that a signal curve S as shown in FIG. 2 arises. As described in the aforementioned German Patent 27 55 956, the gradient $G_y$ could be sinusoidal rather than of a square-wave format.

During the read-out phase, a gradient $G_x$ is generated in the x-direction with constant polarity. Instead of the continuous gradient $G_x$ shown in FIG. 2, individual pulses may be used coincident with the pulse edges of the y-gradient $G_y$.

Given this pulse sequence, the $G_y$ gradient acts as a read-out gradient, and thus effects a frequency coding of the signal S dependent on the y-coordinate. The gradient $G_x$ acts as a phase-coding gradient in the x-direction, with the respective time integral of the gradient $G_x$ being the determining factor for the phase relation of the nuclear spins.

The signal S is measured by phase-sensitive demodulation as a complex quantity. The analog signal acquired in this manner is sampled in a time grid, and the samples are digitized and entered into one row of a measurement matrix M, shown in FIG. 3. The entries in a row of the measurement Matrix M correspond to all samples obtained during one pulse of the gradient $G_y$. N complex values are read out under each pulse (half-wave) of the gradient $G_y$. These are entered into a row of the measurement matrix M as respective entries S(i,j), wherein i is the row index and j is the column index. N individual pulses of the gradient $G_y$ follow after each excitation, so that an N×N matrix M arises.

Because the polarity of the gradient $G_y$ alternates, the measured values are inserted in the measurement matrix M in alternation, first with ascending j values (column index values) and then with descending j values in the next row.

If the data are present on an equidistant grid as the measurement matrix M, an image can be calculated therefrom by a two-dimensional Fourier transformation. The method usually employed for this purpose is set forth in greater detail in German Patent 28 55 956.

The following problem arises in conventional types of Fourier transformation. In order to take the differing gradient direction which occurs during read-out of the signal S into consideration, the right-end direction, as noted above, must be alternated for each row of the measurement matrix. This leaves to a susceptibility to "N/2 ghosts." This phenomena is shown in FIG. 4. A subject for which an image is to be obtained, for example, a circle A in the N×N image matrix, appears in the overall image again, shifted by N/2 points in the positive and negative directions, with reference to the middle of the image matrix. These "ghost images" A' and A" overlap with the "actual" image, and are therefore extremely disturbing.

Such N/2 ghosts appear essentially because, in practice, the positive gradient pulse $G_y^+$ differs slightly from the negative gradient pulse $G_y^-$. The magnetic resonance signals which are read out under these gradients pulses will therefore also differ, which constitute the measured values entered into the even-numbered and off-numbered rows of the measurement matrix M in alternation.

The analog low-pass filtering, which is always used in the signal editing, can also considerably contribute to the appearance of image artifacts. Each such filter has overshoots in the time domain which become more pronounced as the steepness of the filter increases in the frequency domain. An input signal $S_e(t)$ and a low-pass-filtered output signal $S_a(t)$ for a rectangular function are shown in FIG. 5. Respective input and output signals are shown in FIG. 6 for a delta function. Of importance herein is that the input signal $S_e(t)$ is distorted in the positive time direction as a consequence of the causality principle. In conventional imaging, i.e., not based on the echo planar method, this does not result in any significant image artifact. The magnetic resonance signal in such conventional imaging methods is read out under gradients having the same polarity, and the sampled signals are all entered into the rows of the measurement matrix M in the same direction. The aforementioned distortion of the signals in the positive time direction thus does not result in any significant image artifacts.

In the echo planar method, by contrast, the aforementioned N/2 ghosts result because the sampled measured values are written into the rows of the measurement matrix alternating in the positive and negative directions. In the measurement matrix in this method, therefore, the distortion acts in both the positive and negative directions in alternation.

The manner by which the N/2 ghosts can be reduced in accordance with the principles of the present invention, by appropriate processing of the measurement matrix M, is set forth below with respect to an exemplary embodiment of the invention shown in FIG. 7.

The measurement matrix M of FIG. 3, having N×N complex samples (entries) is divided into a sub-matrix u, having entries u(i,j) and a sub-matrix g, having entries g(i,j). The sub-matrix g contains only the rows i of the measurement matrix M having an even-numbered row number, for example, the samples S acquired under individual pulses of the gradient $G_y$ having a positive polarity. The sub-matrix u contains only the lines i of the measurement matrix M having an odd-numbered row number, for example the samples acquired under the negative individual pulses of the gradient $G_y$. The entries in the intervening rows of each of the matrices u and g are set to zero.

Figure 7:
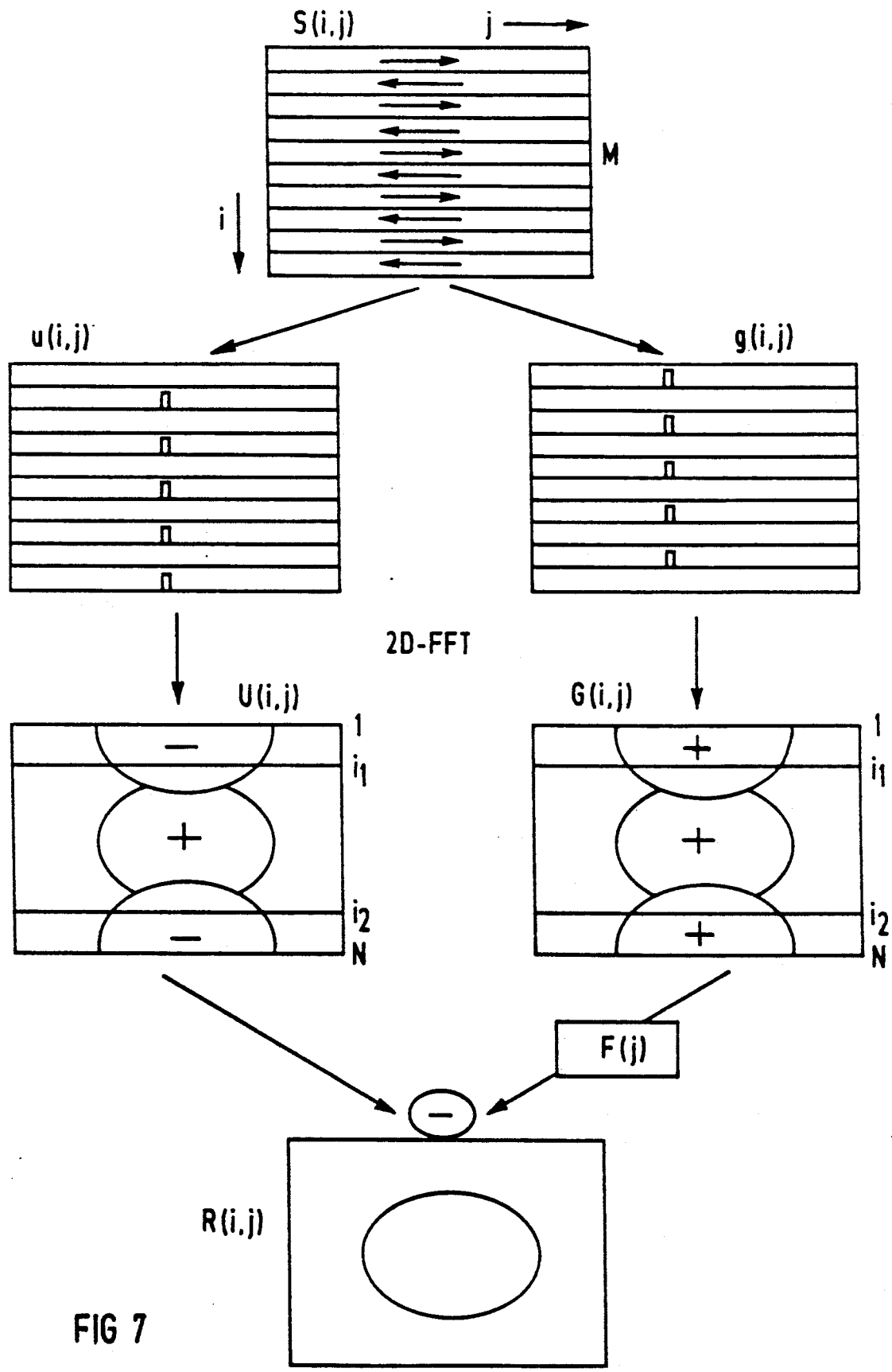
FIG. 7 is a schematic diagram showing the steps of the method in accordance with the principles of the present invention.

Both matrices u and g are subjected to a two-dimensional Fourier transformation (referenced 2D-FFT in FIG. 7). The result of this Fourier transformation is intermediate image matrices G, having entries G(i,j) and U, having entries U(i,j). As shown in FIG. 7, the intermediate image matrices U and G still contain the N/2 ghosts. These ghost images, however, appear negatively in the intermediate image matrix U and positively in the intermediate image matrix G. If, for example, the data were obtained under ideal conditions, i.e., the positive gradient pulse being identical to the negative gradient pulse and no distortions due to the analog low-pass filter being present, an image free of N/2 ghosts could be obtained by adding the intermediate image matrices U and G. In practice, however, such ideal conditions will not be present, for the reasons described above, so that remaining N/2 ghosts will be present. Such N/2 ghosts can be substantially minimized, however, if one of the intermediate image matrices U or G is multiplied by a suitable correction factor by means of a filter having a transfer function F(j).

The transfer function F(j) is calculated from the edge rows i = 1 through i=i$_1$ and i=i$_2$ through i=N. The values i$_1$ and i$_2$ are preferably defined so that the region wherein the N/2 ghosts occur is covered by the edge rows. The transfer function is thus as follows:

$$F(j) = - \left[ \frac{\sum_{i=1}^{i_1} U(i,j) \times G(i,j)^*}{\sum_{i=1}^{i_1} G(i,j) \times G(i,j)^*} + \frac{\sum_{i=N}^{i_2} U(i,j) \times G(i,j)^*}{\sum_{i=N}^{i_2} G(i,j) \times G(i,j)^*} \right]$$

In the above, G(i,j)* is the complex conjugate of the entry G(i,j). In the simplest case, the calculation of the correction transfer function F(j) can be limited to one row.

The final step in substantially eliminating the small N/2 ghosts is to add the matrix entries which have been multiplied by the correction factor F(j), which in the example of FIG. 7 are the entries G(i,j), to the entries U(i,j) of the other intermediate image matrix to obtain a resultant matrix R having entries R(i,j). This is represented by the following equation:

$$R(i,j) = U(i,j) + G(i,j) \times F(j).$$

The resultant image represented by the matrix R has N/2 ghosts which are minimized.

Figure 8:
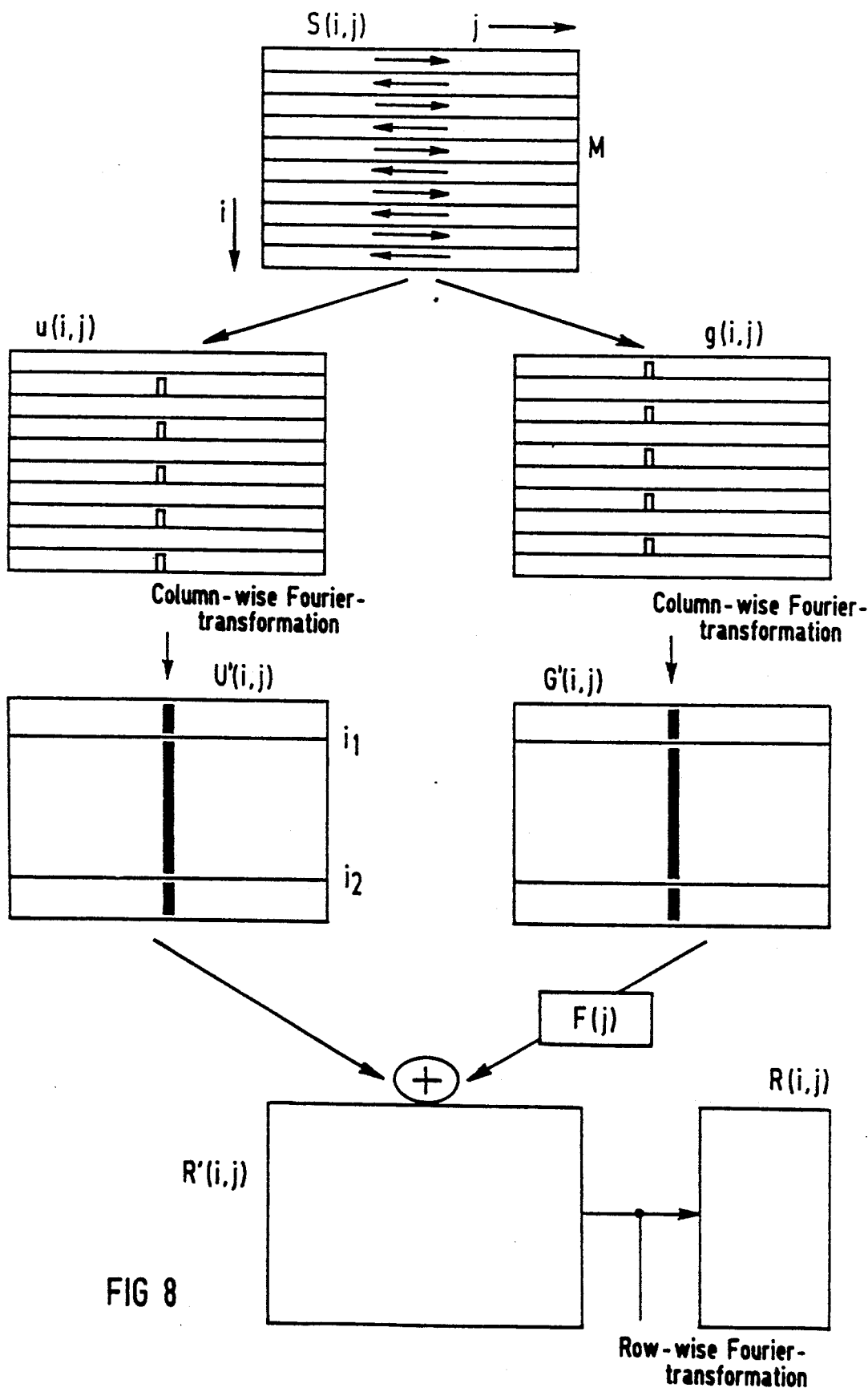
FIG. 8 is a schematic diagram showing the steps of a further embodiment of the method of the present invention.

A modification of the signal processing described above is shown in FIG. 8. The intermediate image matrices U and G are thereby subjected only to a one-dimensional Fourier transformation, in the column direction. Intermediate image matrices U' and G' are thus obtained, and the entries G'(i,j) of the intermediate image matrix G' are again multiplied by the transfer function F(j) in a filter, according to the above equation and the sum U'(i,j) + G'(i,j)×F(j) is formed. A resultant matrix R' having entries R'(i,j) which is obtained is now subjected to Fourier transformation only in the row direction, so that the resultant image matrix R, having entries R(i,j) is obtained. This modification has the advantage that the Fourier transformation in the row direction must be executed only once, namely with respect to the matrix R'.

Figure 9:
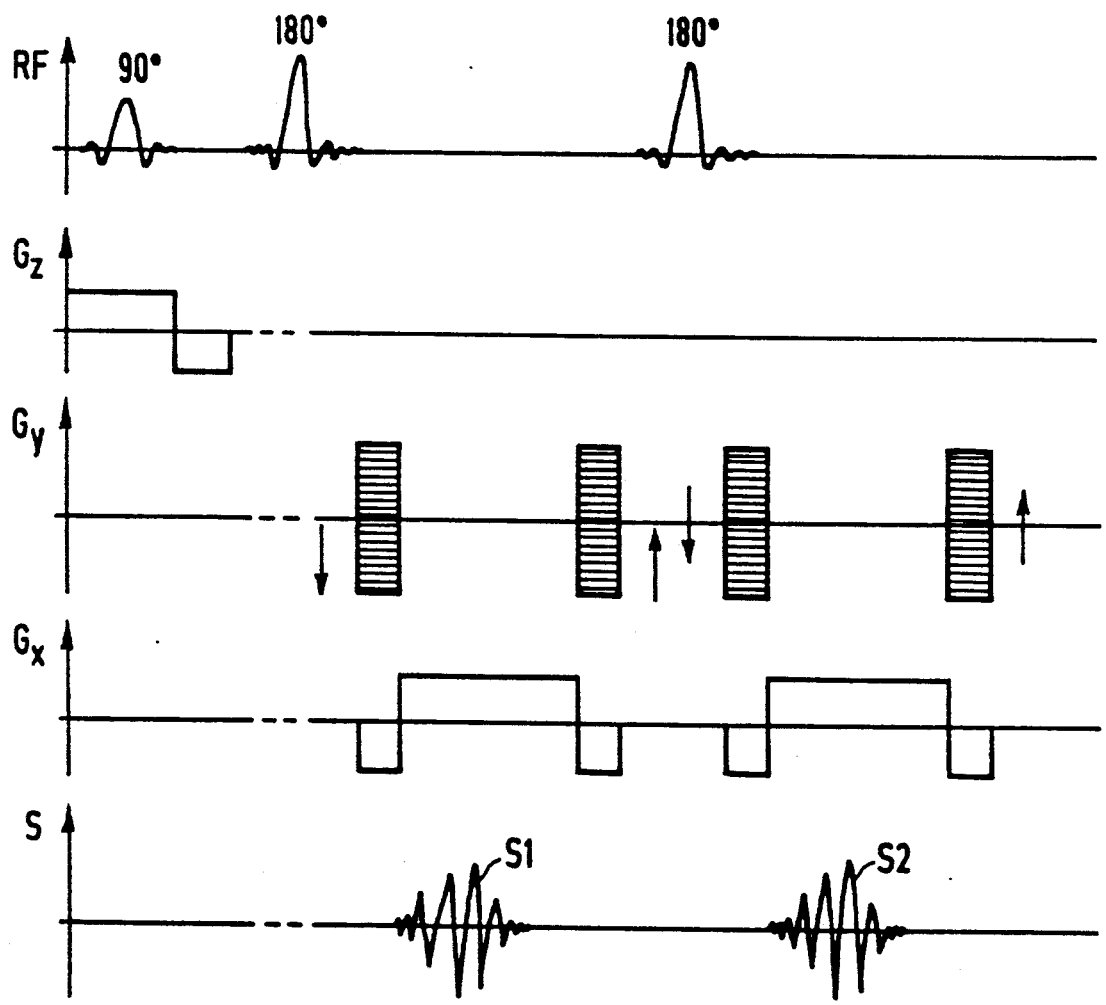
FIG. 9 is a graphical representation of a pulse sequence, and the resulting resonance signal, in the conventional RARE sequence.

The application of the inventive signal processing technique to a RARE sequence shall be set forth below with reference to FIG. 9. In this embodiment, a 90° RF pulse is generated under the influence of a slice selection gradient $G_z$. Subsequently, the slice selection gradient $G_z$ is inverted to cancel the de-phasing in the z-direction which has occurred. After each 90° RF pulse, two echoes S1 and S2 are generated by two successive 180° pulses. For phase coding, a phase coding gradient $G_y$ is generated before and after each echo S1 and S2, the size of this phase-coding gradient $G_y$ changing from scan to scan, i.e. from row to row of the measurement matrix. The phase-coding gradients $G_y$ are thus oppositely directed before and after each echo signal S1 and S2, so that their area integral cancels over the pulse sequence.

The read-out of the echo signals S1 and S2 takes place under a read-out gradient $G_x$ so that the echo signals S1 and S2 are frequency-coded in the x-direction. The area integral of the readout gradient $G_x$ is also zero for each scan, because the positive gradient, under which the signals S1 and S2 are read out, is preceded and followed by respective negative gradient pulses.

As in the echo planar method described above, the signals S1 and S2 are sampled and the samples are respectively entered into a row of a matrix. To obtain a matrix having N rows, N/2 sequence repetitions of the type shown in FIG. 9 are thus required. The rows of the measurement matrix contain echoes S1 and echoes S2 in alternation.

The two echoes S1 and S2, however, differ slightly from each other, because the signal amplitude decays with the longitudinal relaxation time T1. Thus the same condition discussed above is present, which leads to a susceptibility to N/2 ghosts. Such ghosts, however, are substantially eliminated by undertaking a signal processing of the type already described above in conjunction with the echo planar sequence.

Although the inventive method has been described herein in connection with two types of pulse sequences having a susceptibility to N/2 ghosts, those skilled in the art will understand that the method can be used in combination with any imaging method which has such susceptibility to N/2 ghosts. Although other modifications and changes may be suggested by those skilled in the art, it is the intention of the inventors to embody within the patent warranted hereon all changes and modifications as reasonably and properly come within the scope of their contribution to the art.

We claim as our invention:

1. A method for generating an image of an examination subject using nuclear magnetic resonance signals, said method comprising the steps of:
   disposing said examination subject in a fundamental magnetic field;

subjecting the examination subject to RF pulses to induce nuclear magnetic resonance signals in said examination subject;

generating first and second gradient magnetic fields, at least one of which is substantially periodic and a selected portion of said substantially periodic gradient magnetic field defining a scan;

reading out said nuclear magnetic resonance signals in said patient in the presence of said first and second gradient magnetic fields;

entering the samples obtained during a scan in one row of a measurement matrix, said measurement matrix having a number of columns corresponding to the number of scans;

dividing said measurement matrix into a first sub-matrix and a second sub-matrix, said first sub-matrix containing only even-numbered rows of the measurement matrix with intervening rows set to zero and the second sub-matrix containing only the odd-numbered rows of the measurement matrix with intervening rows set to zero;

subjecting said first and second sub-matrices to a Fourier transformation at least in the column direction to obtain a first intermediate image matrix U having entries U(i,j) and a second intermediate image matrix G having entries G(i,j), wherein i is a row number between 1 and N and j is a column number;

multiplying one of said intermediate image matrices by a factor F(j) calculated from edge rows $i=1$ through $i_1$ and $i=i_2$ through N of the intermediate image matrices according to the following equation:

$$F(j) = - \left[ \frac{\sum_{i=1}^{i_1} U(i,j) \times G(i,j)^*}{\sum_{i=1}^{i_1} G(i,j) \times G(i,j)^*} + \frac{\sum_{i=N}^{i_2} U(i,j) \times G(i,j)^*}{\sum_{i=N.}^{i_2} G(i,j) \times G(i,j)^*} \right]$$

wherein G(i,j)* is the complex conjugate of the intermediate image matrix entries G(i,j); and adding the intermediate image matrix multiplied by the factor F(j) with the other intermediate image matrix.

2. A method as claimed in claim 1 wherein said first gradient magnetic field is the substantially periodic gradient magnetic field, and wherein the step of generating said first gradient magnetic field is further defined by generating a first gradient magnetic field consisting of a plurality of individual pulses of alternating polarity, and wherein the step of entering said samples in said measurement matrix is further defined by entering samples obtained during pulses of said first magnetic field gradient having a positive polarity and samples obtained during pulses of said first magnetic gradient field having negative polarity in alternating rows in said measurement matrix so that said first sub-matrix contains all entries obtained during positive polarity pulses of said first gradient magnetic field and said second sub-matrix contains all samples obtained during pulses having negative polarity of said first gradient magnetic field.

3. A method as claimed in claim 1 wherein the step of subjecting said first and second sub-matrices to a Fourier transformation is further defined by subjecting said first and second sub-matrices to a two-dimensional Fourier transformation.

4. A method as claimed in claim wherein the step of subjecting said first and second sub-matrices to Fourier transformation is further defined by subjecting said first and second sub-matrices to a Fourier transformation in the column direction only, and comprising the additional step of subjecting a matrix, obtained in the step of adding, to a Fourier transformation in the row direction only.

* * * * *